United States Patent

Reber et al.

[15] 3,678,348

[45] July 18, 1972

[54] METHOD AND APPARATUS FOR ETCHING FINE LINE PATTERNS IN METAL ON SEMICONDUCTIVE DEVICES

[72] Inventors: Robert L. Reber, Sunnyvale; James C. Huiskens, San Jose, both of Calif.

[73] Assignee: Communications Transistor Corporation, San Carlos, Calif.

[22] Filed: Nov. 23, 1970

[21] Appl. No.: 91,734

Related U.S. Application Data

[63] Continuation-in-part of Ser. No. 62,446, Aug. 10, 1970, abandoned.

[52] U.S. Cl. ....................317/235, 317/234, 29/576, 204/143

[51] Int. Cl. ....................H01l 19/00

[58] Field of Search ....................317/235, 101, 234; 29/576; 204/143 R, 143 YE

[56] References Cited

UNITED STATES PATENTS

| | | | |
|---|---|---|---|
| 3,199,002 | 8/1965 | Martin, Jr. | 317/234 |
| 3,409,523 | 11/1968 | Garbarini | 204/143 |
| 3,417,260 | 12/1968 | Foster, Jr. | 317/235 X |
| 3,560,357 | 2/1971 | Shaw | 204/143 |
| 3,568,305 | 3/1971 | Janning | 204/143 |

*Primary Examiner*—James D. Kallam
*Attorney*—Stanley Z. Cole and Leon F. Herbert

[57] ABSTRACT

A method for etching fine line patterns in a metal film overlaying an apertured insulative layer on a semiconductive substrate is disclosed. In the method, a layer of etch-resistance material is deposited over the metal film to be etched, such etch-resistance layer being apertured with a fine line aperture pattern portion and an open field aperture portion. The open field portion is disposed overlaying the non-apertured portion of the insulative layer. In addition, the layer of etch-resistant material includes a contactor portion bridging between the open field portion of the aperture pattern therein and a nearby aperture through the insulative layer to the semiconductive substrate to protect, from the etchant, a conductive bridge between the semiconductive substrate and the field portion of the metal film to be etched. The conductive bridge forms a conductive path independent of the active semiconductive junctions of the semiconductive device being formed. The metal film is then preferably etched in an electrolytic cell.

12 Claims, 8 Drawing Figures

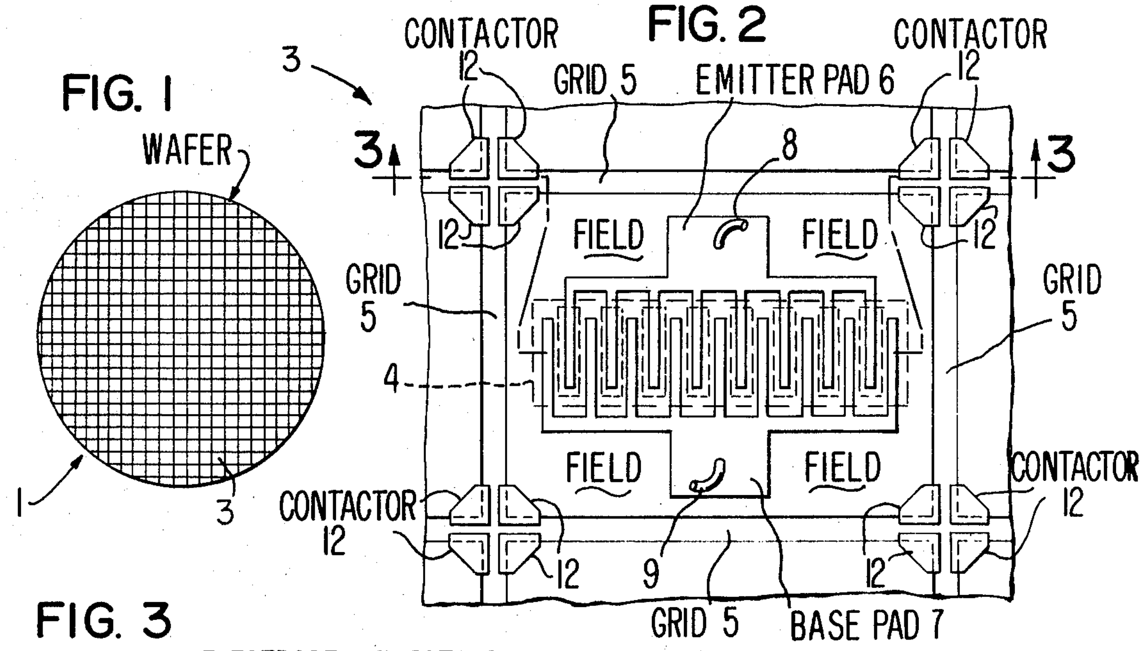
FIG. 1, FIG. 2
FIG. 3
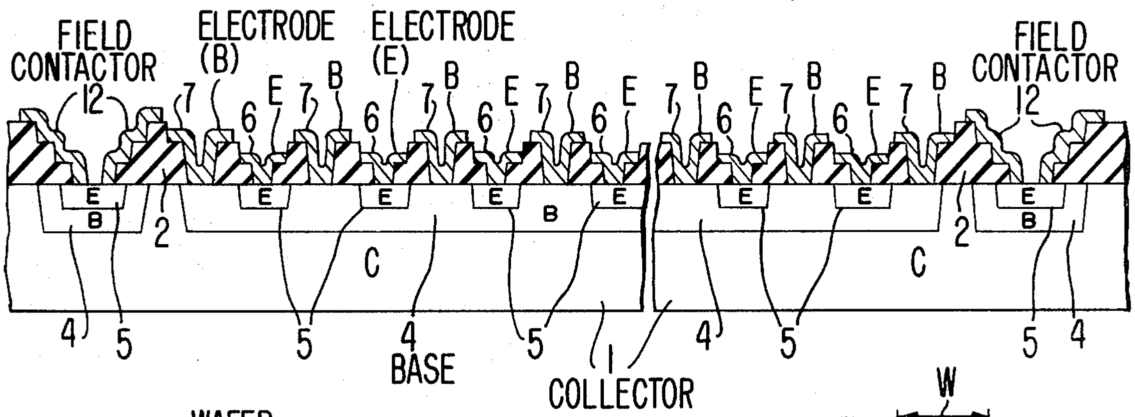
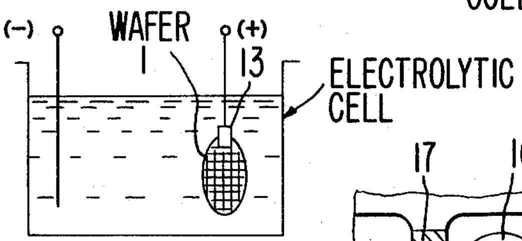
FIG.4
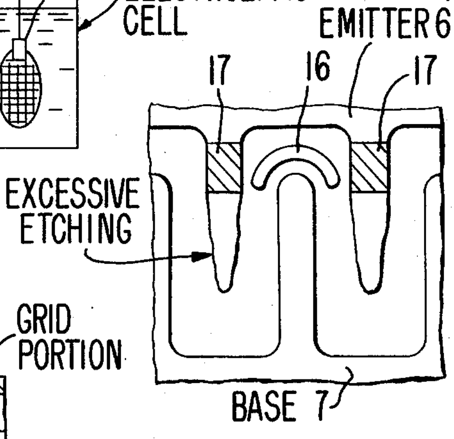
FIG.6
PRIOR ART
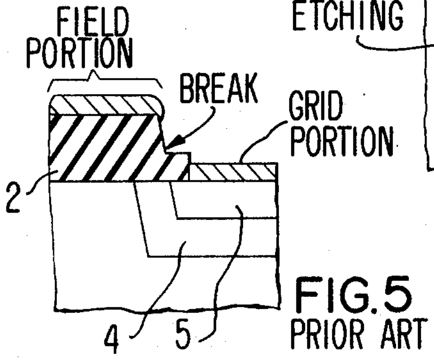
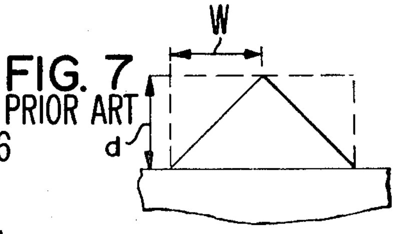
FIG. 7
PRIOR ART
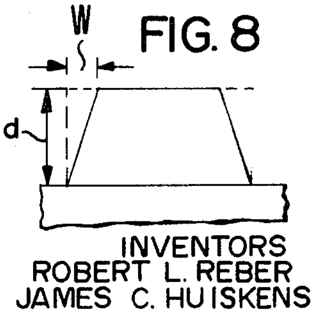
FIG. 8
INVENTORS
ROBERT L. REBER
JAMES C. HUISKENS
BY [signature]
ATTORNEY

METHOD AND APPARATUS FOR ETCHING FINE LINE PATTERNS IN METAL ON SEMICONDUCTIVE DEVICES

RELATED CASES

This application is a continuation-in-part of the now abandoned parent application entitled "Method and Apparatus For Etching Fine Line Patterns In Metal on Semiconductive Devices," U.S. Ser. No. 62,446, filed Aug. 10, 1970, and assigned to the same assignee as the present invention.

DESCRIPTION OF THE PRIOR ART

Heretofore, fine line patterns have been etched in metal film overlaying an apertured insulative layer on a semiconductive substrate. In a typical situation, a semiconductive wafer has formed therein, by diffusion or other means, a multitude of semiconductive devices, such as transistors, diodes, memory circuits, light sensing devices, or integrated circuits. Each such semiconductive device is formed in a region framed by a grid shaped aperture in the insulative layer on the semiconductive device to facilitate dicing of the semiconductive wafer to separate the individual devices formed thereon. One of the last steps in the manufacturing process is to deposit a uniform film of metal, such as aluminum, over the entire surface of the wafer containing the semiconductive device such that the metal film overlays an apertured insulative layer on the semiconductive substrate. The apertures in the insulative layer are in alignment with the semiconductive subregions associated with P-N or N-P junctions for making electrical contact to such subregions. The metal layer forms the various electrodes when etched to provide the electrode patterns. In many semiconductive devices, such as integrated circuits, high power and/or high frequency transistors, and the like, the metal film which overlays the apertured insulative layer is etched to remove or anodize same leaving one or more conductive electrode patterns having a fine line portion, i.e., a plurality of very fine electrically conductive fingers, bars, lines or the like, separated by an electrically insulative void or anodized region and a conductive pad region to which an electrical connection is to be made. The pad region of each pattern is typically surrounded by a portion of the metal film which is to be etched away or etched to anodize same and which will be referred to herein as the "field." As used herein a "fine line" is defined as a line less than 0.001 inch wide and typically is on the order of 0.0002 inch wide.

In the prior art method for making such devices an etch resistant material is formed overlaying the metal layer on the semiconductive waver in relatively complex patterns with openings to the metal corresponding to that portion of the metal to be removed or anodized by etching. For electrolytic etching the wafer is then clamped by a clamping electrode and immersed in an electrolytic etching cell to form one electrode of the electrolytic cell. The wafer is then electrolytic etched to remove or anodize the metal of the fine line portion and of the field portion of each of the semiconductive devices formed on the wafer.

One of the problems encountered in this prior art process has been that the metal to be etched is not etched uniformly. There is a concentrated etching activity in the etching process at or near the fine line finger portions of the electrodes which are not to be etched. Moreover, in certain cases relatively large regions of the wafer will be characterized by insufficient etching of the field portions of the semiconductive devices to be formed thereon. As a result, the yield, of suitable semiconductive devices having fine line electrodes is commonly on the order of 40 percent or less. Attempts have been made to avoid this problem by leaving the wafer in the electrolytic etch for less than the total time required to etch the complete pattern and then continuing to etch the patterns by non electrolytic chemical etching. With this method, yields have been increased but it is found that if the semiconductive devices include dissimilar metals in the metal film to be etched, as will be the case in many integrated circuits and in certain transistors which include resistive elements, the dissimilar metals establish an electromotive force which produces preferential etching of the fine line portions of the patterns, thereby tending to reduce the manufacturing yield for such devices.

SUMMARY OF THE PRESENT INVENTION

The principal object of the present invention is the provision of an improved method and apparatus for etching fine line patterns in metal on semiconductive devices.

One feature of the present invention is the provision of a pattern of etch-resistance material, overlaying the metal layer to be etched, which has a contactor portion covering over a portion of the metal film between the open field portion of the pattern and an aperture through the insulative layer to the semiconductive substrate to provide a conductive bridge between the semiconductive substrate and the field portion of the metal film, such bridge being independent of the fine line portion of the electrode which is not to be removed or anodized by the etching, whereby electrical contact between the substrate and the field portion is assured during the etching step to provide uniform etching and clearing of both the fine line and field portions of the metal pattern to be etched.

Another feature of the present invention is the same as the preceding feature wherein the semiconductive substrate is a semi-conductive wafer having a multitude of fine line metal patterns to be etched thereon and wherein the insulative layer is apertured in a pattern which provides each of the fine line metal patterns to be etched thereon with a framing aperture, and wherein the contactor portion of the etch-resistance pattern bridges between the field portion of each of the metal patterns to be etched and that portion of the metal film overlaying the framing aperture in the insulative layer, whereby a multitude of semiconductive devices formed on a common semiconductive wafer are etched uniformly.

Another feature of the present invention is the same as any one or more the preceding features wherein the metal film is etched electrolytically.

Other features and advantages of the present invention will become apparent upon a perusal of the following specification taken in connection with the accompanying drawings where:

BRIEF DESCRIPTION OF THE DRAWINGS

FIG. 1 is a plan view, in schematic line diagram form, of a semiconductive wafer having a multitude of semiconductive devices to be formed thereon, FIG. 2 is an enlarged detail plan view of one of the semiconductive devices formed on the wafer and framed by intersecting grids of FIG. 1, FIG. 3 is an enlarged sectional view, partially foreshortended of the structure of FIG. 2 taken along 3—3 in the direction of the arrows, FIG. 4 is a schematic line diagram of an electrolytic cell depicting electrolytic etching of the wafer according to the process of the present invention, FIG. 5 is an enlarged sectional view depicting an intermediate phase of the etching step wherein preferential etching is obtained at the edges of apertures in the insulative layer, FIG. 6 is an enlarged plan view of a fine line electrode pattern as etched by the prior art method and depicting the formation of a metal island in the fine line region of the electrode geometry, FIG. 7 is an enlarged sectional view of a fine line electrode etched according to the process of the prior art, and FIG. 8 is a view similar to that of FIG. 7 depicting a fine line electrode etched according to the process of the present invention.

DESCRIPTION OF THE PREFERRED EMBODIMENTS

Referring now to FIGS. 1–3, there is shown a method and apparatus for etching fine line patterns in metal film overlaying an apertured insulative layer on a semiconductive substrate. More particularly, the present method and apparatus is particularly useful for etching fine line electrode patterns on semiconductive devices, such as microwave transistors, integrated circuits, memory circuits, light sensing devices, diodes, and power transistors. In a typical example, a semiconductive wafer 1, as of 0.005 inches to 0.020 inches thick, and comprising a suitable semiconductive material, such as silicon, germanium, gallium arsenide, etc., includes an insulative layer 2 up to 20,000 A thick over one face thereof. Suitable insulative layers 2 include silicon monoxide, silicon dioxide and silicon nitride. In the typical case, a multitude of semiconductive devices, such as 1,000 microwave transistors, are formed on the face of the semiconductive wafer 1. One such device is indicated at 3 in FIG. 2 and is shown plan view.

The multitude of semiconductive devices 3 are formed on the wafer 1 in the conventional manner. More particularly, a negative type of photoresist film is applied to the oxide surface 2, of the wafer 1 and a mask is then brought into place over the photoresist film. The resist is exposed to light through the mask which contains clear and opaque areas in a negative image of the required pattern. The wafer 1 and exposed photoresist film is then developed to form an etch-resistant film in exposed areas and no film in the unexposed areas. The oxide is removed from the unprotected areas by etching to form diffusion windows or apertures. Typically, a base region 4 is diffused through the holes in the oxide layer 2 and the oxide is regrown over the windows after diffusion therethrough. These steps are repeated to form the emitter regions 5. Although a negative type of photoresist film was described above, positive types of photoresist film are available and may be substituted in the conventional manner.

Holes are then cut in the oxide 2 to allow contact to the base and emitter regions 4 and 5, respectively. A metal layer, as of aluminum, gold, platinum or platinum silicon is then deposited to a thickness of one micron to several mills over the entire apertured oxide layer 2 of the wafer 1. A photoresist film is applied to the metal layer on the wafer 1. The photoresist film is developed, as aforedescribed, to provide a developed etch resistant film which is apertured to expose the metal film and which provides an etch resistant protective pattern in accordance with the desired metal electrode pattern to be formed. The metal film is then cut or anodized to the desired electrode patterns by etching the exposed portions of the metal layer or film with an electrolytic etch or with a combination of chemical and electrolytic etch, as more fully described below.

The basic method for forming semiconductive devices, as above described, is disclosed in greater detail in an article titled "Photoresist Process Optimization for Production of Planar Devices, " appearing in the Apr. 4 and 5, 1966 Proceedings of the Second Kodak Seminar on Microminiaturization at pages 44–49, published in 1967 and being available as Kodak Publication No. P–89 from Eastman Kodak Company of Rochester, New York.

The electrode geometry for a typical microwave transistor is as shown in FIGS. 2 and 3. More particularly, in a transistor operating at high current levels and at high frequencies, the emitter current crowds toward the outer parts of the emitter region and consequently, the current handling capacity of the transistor is proportional to the length of the perimeter of the emitter region. Also the emitter to base junction capacitance is a function of the area of the emitter-base junction and, therefore, in order to reduce the junction capacitance of the device, as required for high frequency operation, the emitters preferably have a line shape or very narrow finger shape to provide a large perimeter to area ratio. The metal layer is etched to provide certain electrode patterns for establishing ohmic contact between the emitter and base electrodes 6 and 7 and the respective sub-emitter and sub-base regions 5, and 4, respectively.

Thus, the emitter and base electrodes 6 and 7 typically have a fine line electrically conductive pattern region comprising an array of interdigitated fingers and a wider, larger region or pad portion for allowing an electrical lead to be connected to the respective electrodes. The leads are attached after the devices are separated and such leads are indicated by wires 8 and 9. In a typical case of a high frequency transistor, the fine line portion or finger portion of the respective electrodes usually have widths equal to or less than 0.001 inches. In a particular microwave transistor providing watts of power at 2 GHz the fingers have a width of approximately 0.0002 inches.

The developed etch-resistant photoresist layer, which overlays the metal layer and through which the metal layer is to be etched to form the electrodes 6 and 7, has a fine line aperture pattern portion which opens to the metal layer and which corresponds to the region between the interdigitated fine line portion or fingers of the electrodes 6 and 7. The fine line aperture pattern opens into a field portion of the aperture pattern in the photoresist layer, such field portion being disposed surrounding the pad portions of the electrodes 6 and 7. The field portion is relatively open and is disposed overlaying the insulative layer 2. The field portion also overlays a grid aperture in the insulative layer 2 which opens into a grid subregion which frames each of the semiconductive devices on the surface of the wafer 1. The grid subregion was formed by diffusion through the apertured insulative layer 2 and includes emitter and base subregions 5 and 4, respectively. The metal layer is deposited over the framing grid aperture, in the insulative layer, which is in registration with the subregions of the grid for making electrical contact between the semiconductive wafer 1 and the field portions of the metallic layer.

In accordance with the method of the present invention, the pattern of photoresist material, which is formed over the metallic layer to be etched, includes a contactor pattern portion overlaying the intersections of the grid-shaped framing aperture, in the insulative layer 2, and the respective framing subregions. The contactor portions serve to protect the underlying metal layer which makes electrical connection between the field portion of the metal layer and the semiconductive wafer 1 through the emitter and base subregions of the grid pattern. This assures that, during the etching step, an electrical contact will be maintained between the field portion of the metal layer, to be removed or anodized, and the semiconductive wafer 1. The protected metal portions under the contactor portions of the photoresist comprise metal contactors 12 providing a path of electrical contact between the field portion of the layer and the semiconductive substrate, such conductive path being separate from the path of electrical contact between the field and semiconductive substrate through the fine line portions of the electrodes 6 and 7 and their underlying subregions and active semiconductive junctions. In a preferred embodiment, the metal contactors 12, when etched to remove metal as contrasted with etching to anodize, preferably include a cross-shaped etched line down to the substrate 1 to facilitate scribing of the wafer along the grid lines for dicing. Thus, the etch-resistant protective layer at the corners has the cross-shaped hole formed therein prior to etching the metal layer.

After the photoresist layer with the electrode pattern formed therein is developed over the metal layer to be etched, the wafer 1 is clipped at its edge by a metallic clip 13, see FIG. 4, and immersed in a suitable electrolytic etch. A particularly suitable electrolytic etch for removing the metal by etching includes two parts by volume of phosphoric acid, to one part by volume of water to which a small amount of wetting agents have been added, such as less than 0.1 percent by volume of each of two agents.

A suitable electrolytic etch for anodizing an aluminum layer in certain regions to render the anodized regions insulative relative to the nonetched portion of the aluminum electrode pattern is 15 percent by weight of sulfuric acid in water to which the aforedescribed wetting agents have been added in the same proportions as above described. In the case of etching to remove the metal to form the electrode pattern, the wafer 1 is clipped to the positive electrode and the negative electrode is inserted into the etch solution. A suitable potential to be applied across the electrodes is 1½ volts provided by a standard cell to draw approximately 500 milliamps of current or less with a solution temperature of approximately 40°C. In the case of etching to anodize the aluminum metal layer to form the electrode pattern follow the conventional procedures set forth in the text titled Anodic Oxide Films, by L. Young, published by Academic Press (1961) Chapter 16 to achieve an anodization penetration rate of about 10 $\mu s$ per/hour.

In the electrolytic etching process, the entire wafer is etched uniformly and rapidly. In other words, the provision of the electrical contactors 12, which assures electrical connection between the semiconductive wafer and the field portions of the metal layer to be etched, assures that those portions of the metal layer to be etched are etched uniformly over the entire surface of wafer. The principal electrical contact to the field portions of the metal layer to be etched in through the grid subregions via the electrical field contactors 12 and not through the fine line portions of the electrodes and their underlying subregions and junctions of the semiconductive device.

In the prior art method, which did not use the field contactors 12, the wafer was first subjected to an electrolytic etch followed by a chemical etch. During the electrolytic etch, (see FIG. 5) the first region of the metal layer to etch through to the underlying insulative layer 2 was a very sharp line along the step edge of each of the grid-shaped framing apertures in the insulative layer 2 at the place where the metal layer came over one or more lips of the framing aperture. This is shown in FIG. 5 in the region identified as the break. When the break was complete the field portion, remaining to be etched, was electrically isolated from the grid and any current to be supplied to the field portion had to then be supplied through the active semiconductive junctions and through the overlaying fine line portions of the respective electrodes 6 and 7.

As the electrolytic etch progressed, the grid lines completely cleared leaving the uppermost semiconductive grid line subregion 5 exposed. The fine line portions of the electrode pattern also continued to be etched and breaks began to appear along the lips of the steps in the insulative layer adjacent the fine line aperture pattern portion in the insulative layer. Quite often these breaks would result in islands of metal layer being disconnected from both of the electrodes and from the field, as indicated at 16 in FIG. 6.

In some high frequency transistors, and in other circuits, resistive elements are formed at the root of the emitter fingers, as indicated at 17 in FIG. 6. These resistors 17 are merely thin film resistors, typically made of a material such as Nichrome, tantalum or boron nitride making a bridging connection between the finger and the pad portions of the electrode. When such fingers, with the dissimilar metal resistive elements in series therewith, are immersed in the electrolytic etch the dissimilar metal junctions produce an electromotive force, thereby setting up an additional electrolytic cell. When the field portions of the metal layer separate electrically from the grid region of the semiconductive substrate, by etching along the break line, as described with regard to FIG. 5, the field etching rate is substantially reduced but the fingers remain connected to the substrate through the semiconductive subregions and junctions. Therefore, the field does not properly clear while etching of the fingers continues. When the wafer is removed from the electrolytic cell and placed in a pure chemical etch, to obtain more uniform etching, the electromotive force produced by the junction of the dissimilar metals causes much faster etching of the fingers than of the field portions. As a result, excessive etching of the fingers is obtained, as indicated in FIG. 6, and the production yield is relatively low.

Using the prior art etching method, without the provision of the electrical contactors for making electrical connection between the wafer 1 and the field portion of the metal film to be etched, a typical etch factor of 1 was obtained for fine line portions of the electrodes to be etched. The "etch factor" is defined as the depth of the fine line portion being etched divided by the maximum width of the removed or anodized portion of the line being etched, thus, in a typical fine line of the prior art which had a width of 2 microns 1 micron of the etch portion would be removed for every micron of depth being etched. Such an example is shown in FIG. 7. However, utilizing the field contactors 12 of the present invention, much higher resolution for fine line portions being etched is obtained and the etch factor is substantially increased to on the order of 2 to 3, as indicated in FIG. 8.

Thus, the present invention substantially improves the uniformity and rapidity with which fine line electrode patterns may be etched in metal films. The invention is greatly to advantage when employed for etching metal film geometries having junctions between dissimilar metals such as those cases where the circuits or electrodes include metal film of one type of metal with series resistive elements of another metal. Moreover, the etch factor is significantly improved by use of the present invention.

As thus far described, the contactor members 12 have been provided at the intersections of the grid lines in the wafer. However, this is not a requirement and the contactors 12 may be disposed in other locations for making electrical contact between the field portion of the metal layer to be etched and the semiconductive wafer through the semiconductive regions of the grid lines. Also, in another embodiment of the present invention the insulative layer 2 has enlarged apertures at the intersecting corners of the grid lines to provide a larger area for electrical contact between the contactors 12 and the semiconductive substrate.

After the wafer 1 has been etched, the individual semiconductive devices are separated by scribing the wafer 1 along the grid lines and dicing the wafer into the individual semiconductor devices. When this has been completed, portions of the contactors 12 will remain on the semiconductive device. However, these contactors 12 do not make electrical contact between any of the electrodes of the device and therefore do not adversely affect the operation thereof. Therefore, such contactors need not be removed from the device.

As used herein "etching" is defined to include selective removal or oxidation of metal to form a remaining metallic electrode pattern in a metal layer.

Since many changes could be made in the above construction and many apparently widely different embodiments of this invention could be made without departing from the scope thereof, it is intended that all matter contained in the above description or shown in the accompanying drawings will be interpreted as illustrative and not in a limiting sense.

What is claimed is:

1. In a method for making a device having a semiconductive substrate; an insulative layer disposed on said substrate; said insulative layer having an apertured pattern therein extending to said substrate; said apertured pattern having a fine line portion and a separate open field contactor portion; a metal layer overlaying said insulative layer and having, an open field portion overlaying a non-apertured portion of said insulative layer, a fine line pattern portion overlaying said fine line aperture pattern portion of said insulative layer, and an open field contactor portion overlaying said open field contactor apertured portion of said insulative layer; said metal layer also overlaying the sidewalls of said overlayed apertured portions of said insulative layer for making electrical contact to said substrate; said open field contactor portion of said metal layer providing an electrical connection for connecting said open field portion of said metal layer to said semiconductive substrate via a path separate of said fine line metal pattern portion of said metal layer; said method including the steps of, forming an apertured layer of etch-resistant material overlaying said metal layer, said layer of etch-resistant material having an apertured pattern to the metal layer for exposing same with a fine line aperture pattern portion and an open field aperture pattern portion, said etch-resistant layer having a protective portion covering a fine line pattern portion of said metal layer and a separate protective portion covering said metal layer in said open field contactor portion thereof, and etching the exposed areas of said metal layer through said apertured etch-resistant layer for forming a fine line metal pattern and for forming a separate open field electrical contactor portion bridging between said semiconductive substrate and the etched open field portion of said metal layer.

2. The method of claim 1 wherein the semiconductive substrate is a semiconductive wafer having a multitude of fine line metal patterns to be etched thereon, and wherein the insulative layer is apertured in a pattern which frames each of the fine line metal patterns to be etched thereon with a framing aperture, and wherein the contactor protective portion of the etch-resistant layer formed on the metal layer bridges between the open field portion of each of the metal layer patterns to be etched and that portion of the metal layer overlaying the framing aperture in the insulative layer.

3. The method of claim 2 wherein the framing aperture pattern in the insulative layer is an intersecting grid pattern.

4. The method of claim 1 wherein the step of etching the exposed portion of the metal layer includes the step of, electrolytic etching the exposed portions of the metal layer in an electrolytic cell.

5. The method of claim 1 wherein the step of etching the metal layer includes the step of anodizing the exposed portions of the metal layer.

6. In a method for making semiconductive devices the steps of, forming first and second subregions of differing conductivity type in a semiconductive substrate, forming first and second fine line pattern apertures in an electrically insulative layer overlaying the substrate with the first and second fine line patterns of apertures disposed in registration over the first and second subregions, respectively, depositing a metal layer over the apertured insulative layer for making electrical contact to the respective first and second subregions, forming first, second and third patterns of etch-resistant material over the metal film, each of said first and second patterns of etch-resistant material having a fine line portion overlaying the respective first and second subregions and an enlarged electrical pad portion overlaying the insulative layer, the layer of etch-resistant material having an apertured pattern opening to expose the metal layer, such opening pattern in the etch-resistant layer having a fine line pattern portion disposed in between the fine line portions of the first and second patterns of etch-resistant material and a field portion overlaying the insulative layer in the regions surrounding the pad portions of the first and second patterns of etch-resistant material and a third pattern of etch-resistant material being formed over the metal layer bridging a region thereof between the field portion of the aperture pattern in the etch-resistant material and un underlying contactor aperture in the insulative layer to the semiconductive substrate, such contactor aperture being covered by the metal layer, and etching the metal film through the aperture pattern in the etch-resistant material to form first, second and third metal electrode patterns on the semiconductive device, such first and second electrode patterns having fine line portions and the third electrode pattern forming an electrical conductor providing an electrically conductive path between the field region of the device and the semiconductive substrate such electrical conductive path being separate from other conductive paths from the field to the substrate through the first and second electrodes.

7. The method of claim 6 wherein the aperture in the insulative layer through which the third electrode pattern makes electrical contact between the field region of the metal layer and the semiconductive substrate is an aperture which surrounds the first and second electrode patterns.

8. The method of claim 7 wherein there are a multitude of first and second electrode pairs formed on the semi-conductive substrate, and wherein the aperture which surrounds the first and second electrode patterns has a pattern of intersecting grid lines defining an aperture pattern which frames each of the electrode pairs.

9. The method of claim 8 wherein the third electrodes are formed at intersecting corners of the framing aperture pattern.

10. The method of claim 6 wherein the step of etching the exposed portions of the metal layer includes the step of, electrolytic etching the exposed portions of the metal layer in an electrolytic cell.

11. The method of claim 6 wherein the step of etching the exposed portions of the metal layer includes the step of anodizing the exposed portions of the metal layer.

12. In a semiconductive device, a semiconductive substrate member having a first region of a first conductivity type, a second region of said substrate member having a second conductivity type forming a P-N junction at the interface of the first and second regions of said substrate, said second region of said substrate having a fine line pattern portion forming a fine line P-N junction pattern at the interface with said first region of said substrate, a layer of electrically insulative material disposed overlaying said substrate, said insulative layer having apertures in a pattern in registration over said second region of said substrate and forming a fine line aperture pattern portion of said insulative layer, a first metallic layer electrode overlaying portions of said insulative layer including portion of the apertured pattern in registration with said second region in the fine line portion of said substrate and providing an electrode path for electrical connection to said first region of said substrate through said second region of said substrate, an electrical lead affixed to said first metallic electrode, and a second metallic layer electrode having a first portion disposed over said insulative layer and having a second portion extending over the outer edge of said insulative layer to said substrate and forming an electrically conductive path therebetween.

* * * * *